(12) United States Patent
Bieg et al.

(10) Patent No.: US 10,394,748 B2
(45) Date of Patent: Aug. 27, 2019

(54) INTEGRATED CIRCUIT FOR OPERATING ON A BUS, AND METHOD FOR OPERATING THE INTEGRATED CIRCUIT

(71) Applicant: CONTINENTAL AUTOMOTIVE GMBH, Hannover (DE)

(72) Inventors: Bernhard Bieg, Regensburg (DE); Christoph Haggenmiller, Regensburg (DE); Klaus-Dieter Schneider, Lappersdorf (DE); Andrey Shadrin, Regensburg (DE)

(73) Assignee: CPT Group GmbH, Hannover (DE)

( * ) Notice: Subject to any disclaimer, the term of this patent is extended or adjusted under 35 U.S.C. 154(b) by 0 days.

(21) Appl. No.: 15/879,854

(22) Filed: Jan. 25, 2018

(65) Prior Publication Data

US 2018/0150430 A1   May 31, 2018

Related U.S. Application Data

(63) Continuation of application No. PCT/EP2016/063801, filed on Jun. 15, 2016.

(30) Foreign Application Priority Data

Jul. 27, 2015   (DE) ........................ 10 2015 214 133

(51) Int. Cl.
 *G06F 13/42*   (2006.01)
 *G11C 7/10*    (2006.01)
 *G11C 8/16*    (2006.01)
 *G11C 16/14*   (2006.01)

(52) U.S. Cl.
 CPC ...... *G06F 13/4291* (2013.01); *G06F 13/4273* (2013.01); *G11C 7/1048* (2013.01); *G11C 8/16* (2013.01); *G11C 16/14* (2013.01)

(58) Field of Classification Search
 CPC .................................................. G06F 13/4282
 (Continued)

(56) References Cited

U.S. PATENT DOCUMENTS 5,781,796 A   7/1998   Lee
5,953,509 A   9/1999   Ciccarelli et al.
(Continued)

FOREIGN PATENT DOCUMENTS

DE   19522335   1/1997
DE   19825292   4/1999
(Continued)

OTHER PUBLICATIONS

International Search Report and Written Opinion dated Aug. 12, 2016 from corresponding International Patent Application No. PCT/EP2016/063801.

(Continued)

*Primary Examiner* — Min Huang (57) ABSTRACT

An integrated circuit includes a reception port an address port, and a memory with a number of memory sections for storing activation information. The number of memory sections is equal to the number, encodable by the address port, of activatable integrated circuits that are operable over a common bus. A control unit is configured to compare the address encoded by the address port with an address received at the reception port. The control unit writes a defined bit pattern to the memory section associated with the address in the event of a positive comparison, and withholds transmission of a negative acknowledgement signal in the event of a negative comparison. The integrated circuit is configured to be activated by the defined bit pattern in the memory section that corresponds to the address defined at the address port, for communicating with a microprocessor connected to the integrated circuit via the common bus.

10 Claims, 6 Drawing Sheets

(58) Field of Classification Search
USPC .................................................. 711/E12.001
See application file for complete search history.

(56) References Cited

U.S. PATENT DOCUMENTS

| | | | | |
|---|---|---|---|---|
| 6,141,704 | A * | 10/2000 | Huang | G06F 13/4269 |
| | | | | 710/15 |
| 6,438,624 | B1 | 8/2002 | Ku et al. | |
| 6,775,169 | B1 * | 8/2004 | d'Acoz | G06Q 20/341 |
| | | | | 365/52 |
| 2003/0093607 | A1 | 5/2003 | Main et al. | |
| 2008/0052449 | A1 * | 2/2008 | Kim | G06F 13/1678 |
| | | | | 711/103 |
| 2011/0153888 | A1 * | 6/2011 | Sun | G06F 13/4256 |
| | | | | 710/107 |
| 2012/0151156 | A1 * | 6/2012 | Citron | G06F 9/30043 |
| | | | | 711/154 |
| 2013/0242749 | A1 | 9/2013 | Herz et al. | |
| 2017/0277651 | A1 * | 9/2017 | Ngo | G06F 13/4282 |

FOREIGN PATENT DOCUMENTS

| | | |
|---|---|---|
| DE | 102013004542 | 9/2013 |
| EP | 2688258 | 1/2014 |
| EP | 2884402 | 6/2015 |

OTHER PUBLICATIONS

German Office Action dated Mar. 24, 2016 for corresponding German Patent Application No. 10 2015 214 133.0.

* cited by examiner

FIG 1

(State of the art)

INTEGRATED CIRCUIT FOR OPERATING ON A BUS, AND METHOD FOR OPERATING THE INTEGRATED CIRCUIT

CROSS REFERENCE TO RELATED APPLICATIONS

This application claims the benefit of International application No. PCT/EP2016/063801, filed Jun. 15, 2016, which claims priority to German patent application No. 10 2015 214 133.0, filed Jul. 27, 2015, each of which is hereby incorporated by reference.

BACKGROUND

A high-speed serial interface or high-speed serial link (HSSL), as described in DE 10 2013 004 542 A1, makes it possible to connect a microcontroller and a remote station, such as, for instance, another microcontroller or a less powerful modular unit such as an ASIC (application specific integrated circuit) using a small number of lines and nevertheless achieve a high data rate.

This interface is conceived as a bidirectional point-to-point connection, with both users able to transmit messages at any time. Each message is acknowledged with a confirmation signal—a positive-acknowledgement signal—or a non-confirmation signal—a negative-acknowledgement signal. Transmission can take place on various prioritizable logical channels. Longer messages are split into several message packets. As a result, it is possible to interrupt longer low-priority messages and to embed higher-priority messages. By virtue of the logical channels, it is also possible to assign the positive-acknowledgement and negative-acknowledgement signals to a message. The protocol allows the transmission of an address, so that writing can take place from the transmitter directly into memory areas of the receiver. The electrical protocol allows, in addition, the outputs of an individual bus user to be switched to high impedance.

By virtue of the point-to-point connection which is merely provided, only one remote station—in engine control units, typically a user-specific modular unit (ASIC)—is able to communicate with the microcontroller. This is not always of practical use; for reasons of system partitioning it would be advantageous to be able to operate also several ASICs at this interface. However, the difficulty in this case lies in the fact that the microcontrollers are already available and the interface specification cannot be changed.

SUMMARY

It is therefore the object of the invention to specify an integrated circuit (ASIC) and a method, with which an operation of several remote stations with a microcontroller with such a high-speed interface on a bus is possible.

Accordingly, the integrated circuit has been formed with at least one transmission port, at least one reception port and at least one address port, and includes a memory or a memory area which has a number of memory sectors to which an item of activation information may be written. The number of memory sectors is equal to the number, codable by the at least one address port, of activatable integrated circuits capable of being operated on a common bus. In addition, the integrated circuit has been formed with a control unit which has been configured to compare the address coded by the at least one address port with an address received at the reception port and, in the case of concordance, to write a defined bit pattern to the memory sector assigned to the address and, in the case of non-concordance, to suppress a negative-acknowledgement signal at the transmission port. The integrated circuit is configured to be activated, by the defined bit pattern in the memory sector that corresponds to the defined address at the at least one address port, for communication with a microprocessor connected to the at least one transmission port and at least one reception port via the common bus.

In the case of a method according to embodiments of the invention for activating an integrated circuit from a group of at least two integrated circuits, connected to a master unit via a bus, for communication with the master unit, wherein the bus comprises at least one transmitting line, leading from the master unit to the integrated circuits, and a receiving line leading from the integrated circuits to the master unit, and the integrated circuits are designed as described above, the following steps are carried out:

the master unit transmits to the integrated circuits linked to the bus a signal that contains a command for writing a defined bit pattern to the memory sector that corresponds to the address, coded at the at least one address port, of the integrated circuit selected for a communication, in each integrated circuit, the transmitted memory-sector address is compared with the address coded at the at least one address port, and the defined bit pattern is written only to the corresponding memory sector, and a positive-acknowledgment signal is transmitted to the master unit if a concordance is established, in the case of an establishment of non-concordance, no negative-acknowledgment signal is transmitted to the master unit from the concerned integrated circuits linked to the bus, and no further reaction to signals from the master unit occurs until the reception of a new command for writing to one of the memory sectors.

The logic of the integrated circuits to be linked to the bus is accordingly implemented in such a way that the microcontroller sees a specification-compliant, point-to-point connection at any time. Nevertheless, it is possible for the microcontroller to communicate with all the integrated circuits linked to the bus, in that by the transfer of a token, namely the defined bit pattern, into the appropriate memory sector it activates only the integrated circuit for communication that has been provided for communication.

Since the high-speed serial interface in existing microcontrollers is fixed and cannot be changed, in the manner according to embodiments of the invention, the other bus users, namely the integrated circuits (ASICs), are designed in such a way that the logic thereof enables a bus operation of this high-speed serial interface.

The electrical specification and the protocol of the high-speed serial interfaces realized in commercially available microcontrollers prohibit the simultaneous transmitting of several bus users. In the system described herein, the microcontroller serves as arbitration master of the individual integrated circuits. The microcontroller grants or withdraws the transmit permission. To this end, it allocates the transmit entitlement the—so-called token—in each instance to another bus user or integrated circuit (ASIC). For this purpose, an integrated circuit has been formed. The integrated circuit with token switches its transmitting outputs and receiving inputs to be active. In all the other integrated circuits, the transmitting outputs are high-impedance and the receiving inputs do receive every message, but this does not result in a reaction. In principle, arbitrarily many bus users may be linked.

In order to select an integrated circuit, in each integrated circuit a special memory sector—the so-called token memory sector—has been provided for activation/deactivation of the integrated circuit. In this memory sector, the microcontroller saves the so-called token in the form of a defined bit pattern which may also be of only one bit. It is additionally possible to save further communication-specific parameters in the token memory sector. The integrated circuit with token is active, and all the other integrated circuits are passive.

The base address of the token memory sector is established by address pins on the integrated circuit. The integrated circuit reads in this bit combination established by the voltages at the address pins after a RESET and therefore establishes its base address. The microcontroller knows the base addresses of all the integrated circuits.

Normally, an integrated circuit would respond to an attempt to write to a non-existent address with a negative-acknowledgment signal and would thereby interfere with the awarding of a token of such a system.

Therefore, every possible token memory sector is known to all the integrated circuits, in that a memory or memory area in the integrated circuit includes an assigned memory sector for each possible bit combination at the address ports. Now if writing takes place to the token memory sector associated with the base address that is defined by the bit combination at the address ports, the integrated circuit responds with a positive-acknowledgment signal. If writing takes place to another token memory sector, the integrated circuit does not respond. By virtue of this behavior, if no integrated circuit already possesses the token, the token may be allocated to an integrated circuit, without the other integrated circuits interfering with this awarding by transmitting negative-acknowledgment signals.

In this way, the microcontroller may allocate the token by simple write accesses to the memory sector assigned to the base address of an integrated circuit.

In a further development, prior to the activation of another of the integrated circuits connected to the common bus, first a deactivation of the previously activated integrated circuit is effected by a signal transmitted from the master unit to the activated integrated circuit, which brings about a change in the content of the memory sector described by the defined bit pattern. In this way, the token is withdrawn from an integrated circuit.

This may be effected, for instance, by an inversion of the memory-sector content or erasure thereof being effected.

The details of one or more implementations of the disclosure are set forth in the accompanying drawings and the description below. Other aspects, features, and advantages will be apparent from the description and drawings, and from the claims.

BRIEF DESCRIPTION OF THE DRAWINGS

The embodiments of the invention will be described in more detail in the following on the basis of embodiments with the aid of figures. Shown therein are FIG. 1, which shows a point-to-point connection of a microcontroller to an integrated circuit according to the state of the art, FIG. 2, which shows an arrangement with three integrated circuits on a bus connected to a microcontroller according to an embodiment, FIG. 3, which shows an arrangement with two integrated circuits on a bus connected to a microcontroller according to an embodiment, FIG. 4, which shows a diagrammatic representation of a memory area with memory sectors, FIG. 5, which shows a memory sector with and without token, FIG. 6, which shows a flow chart of a method for awarding of a token, according to an embodiment, and FIG. 7, which shows a flow chart of a method for withdrawal of a token and for re-awarding of a token, according to an embodiment.

DETAILED DESCRIPTION

Figure 1:
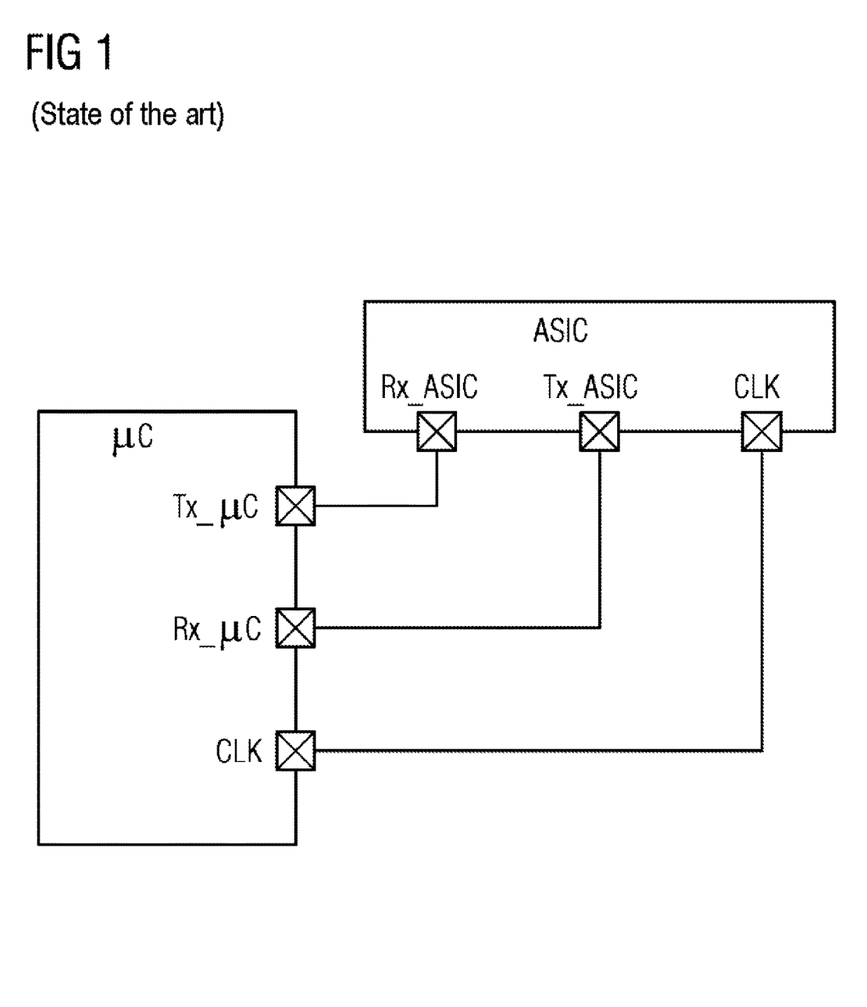

FIG. 1 shows a point-to-point connection between a microcontroller µC and an integrated circuit ASIC by means of only three lines. In this case, a transmission port $Tx\_µC$ is connected to a reception port $Rx\_ASIC$, a reception port $Rx\_µC$ is connected to a transmission port $Tx\_ASIC$, and a respective clock-signal port CLK of the microcontroller µC and of the integrated circuit ASIC are connected to one another. The connection that is represented is intended to be realized as a high-speed serial interface, for instance according to DE 10 2013 004 542 A1—as described above—that is to say, the integrated circuit ASIC acknowledges each signal received by the microcontroller µC by the confirmation of a correct reception ACK or by a negative-acknowledgment signal NACK if the transmission was faulty or if an address not existing in the integrated circuit ASIC was addressed by the microcontroller µC.

For this reason, it is not possible to link further integrated circuits to this known interface, since in the case of the addressing of an integrated circuit by the microcontroller µC all the other integrated circuits linked to the interface, which necessarily cannot have this address, acknowledge with a negative-acknowledgment signal NACK and in this way would interfere with the signal transmission.

Figure 2:
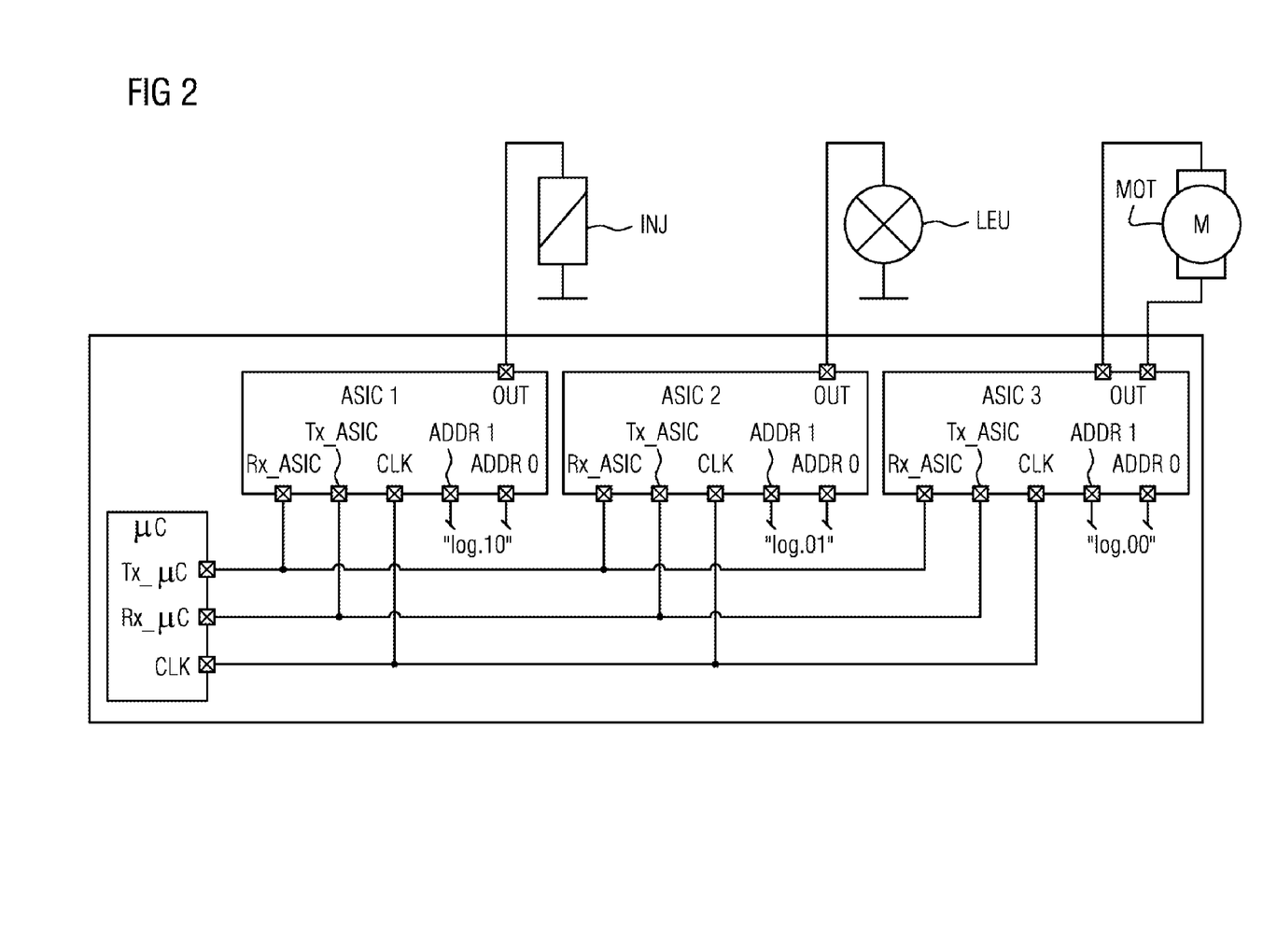

Desirable is an arrangement according to FIG. 2, in which, via a high-speed serial interface described above, several integrated circuits ASIC1, ASIC2, ASIC3 linked thereto may be linked to a microcontroller µC without interfering with a communication between the microcontroller µC and one of the integrated circuits ASIC1-ASIC3, even though the standard protocol is being applied and also the interface is implemented in the microcontroller µC in accordance with the standard. This is desirable, since, for instance in the case of applications in the control unit of a motor vehicle, differing loads—such as, for instance, a magnetic injector INJ, a lamp LEU or a motor MOT—may be driven by means of the outputs of the integrated circuits in ASIC1-ASIC3, in which case the integrated circuits ASIC1-ASIC3 themselves are to be capable of being operated by the microcontroller µC on only one bus.

In the manner according to an embodiment of the invention, first of all the integrated circuits ASIC1-ASIC3 are equipped with address ports ADDR0, ADDR1 which may be connected to particular potentials, in order in this way to be able to address the integrated circuits ASIC1-ASIC3 by a respectively different bit combination. In the example represented in FIG. 2, only two address ports ADDR0, ADDR1 are present, so that a total of 4 bit combinations may be realized and consequently a maximum of 4 integrated circuits may be linked to the interface that is represented. Depending upon how many integrated circuits are to be operated at such an interface, correspondingly many address ports have to be provided.

Figure 3:
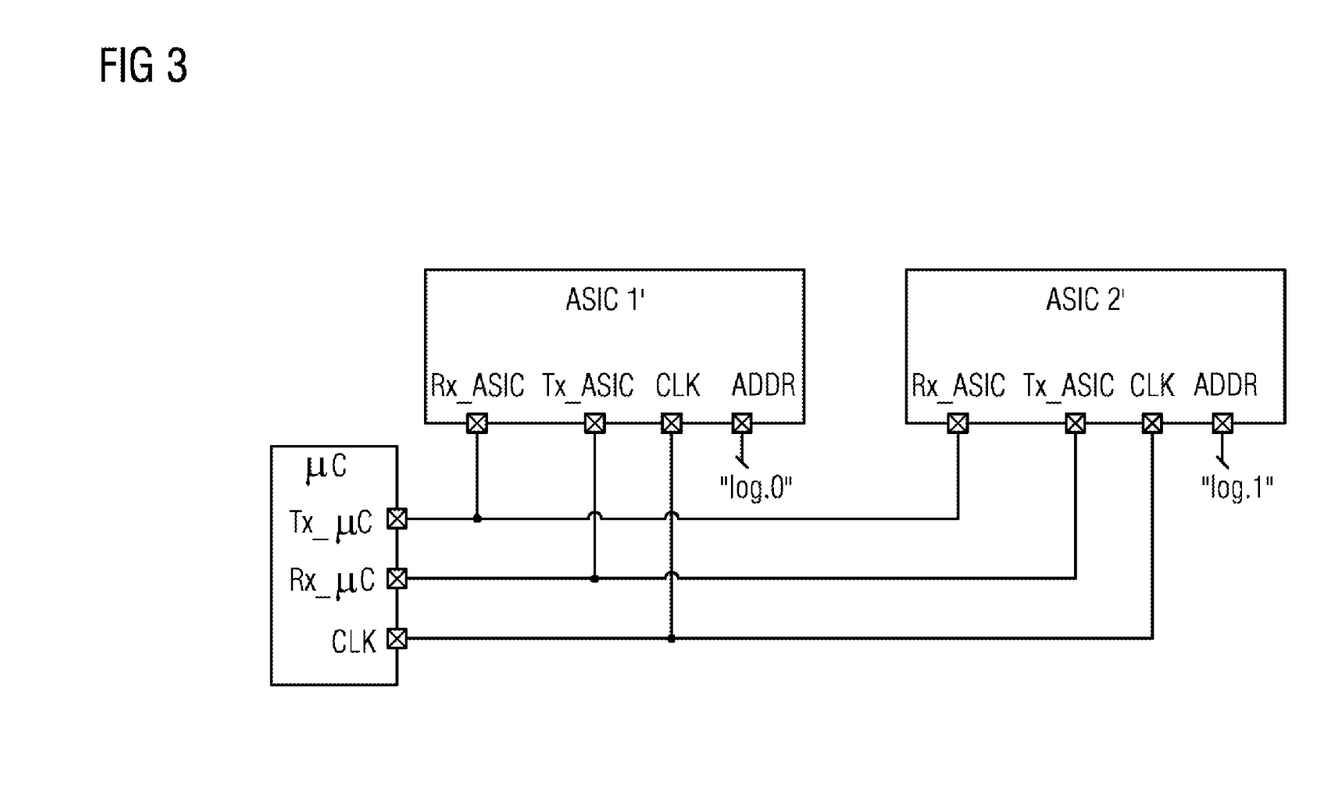
Figure 4:
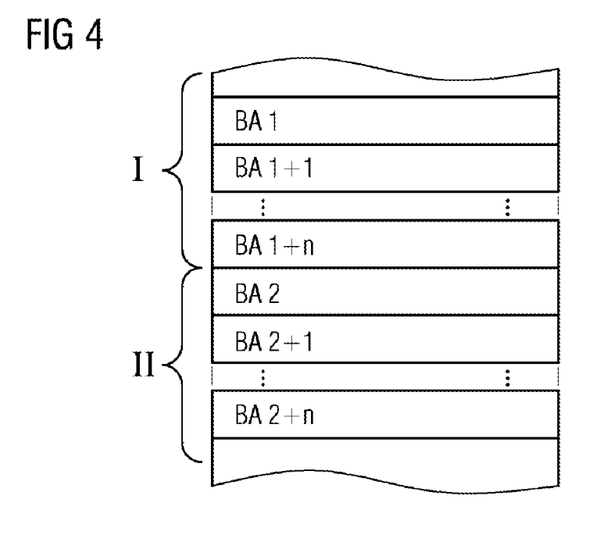
Figure 5:
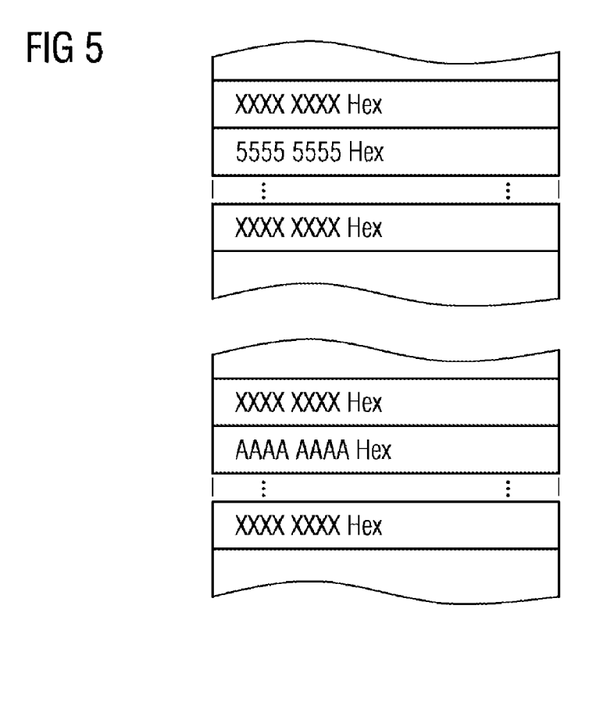

The further internal structure of the integrated circuits and the method for activating a respective integrated circuit for communication with the microcontroller will be elucidated in more detail with the aid of FIGS. 3-5 on the basis of the example of only one address port and hence the possibility of addressing only two integrated circuits.

Represented in FIG. 3, equivalent in this regard to the representation shown in FIG. 2, is the connection of a microcontroller μc via an already described high-performance serial interface to two integrated circuits ASIC1' and ASIC2', which in this case are to include only one address port ADDR which have differing voltage levels applied to them in order to represent the base addresses thereof by "log. 0" and "log. 1".

Both integrated circuits ASIC1' and ASIC2' include, in addition to their address ports ADDR, a memory or memory area which for each possible address—that is to say, in the example represented, for two possible addresses—include a memory sector I, II, the physical addresses of which are known to the microcontroller μC, and to which the microcontroller may write a defined bit combination, which may also be of only one bit, by way of token.

In the example represented, a first memory sector I is to have been assigned to base address "log. 0", and a second memory sector II to base address "log. 1". For instance, if the microcontroller μC would like to activate the first integrated circuit ASIC1', the microcontroller transmits via the transmitting line Tx_μC a write command to base address BA1 which is received by both integrated circuits ASIC1', ASIC2' and is compared with the base address at their address port ADDR. Only the first integrated circuit ASIC1' establishes a concordance and permits the write operation to its first memory sector at address BA1, into which the token is now entered. In addition, the circuit transmits a positive-acknowledgment signal to the microcontroller μC.

The second integrated circuit ASIC2' likewise checks the transmitted base address with that at its address port ADDR and establishes a non-concordance. In the manner according to an embodiment of the invention, however, in this case the circuit will not transmit a negative-acknowledgment signal to the microcontroller μC and in this way interfere with the flow of information between the microcontroller μC and the first integrated circuit ASIC1', but will switch its transmitting output to high impedance and in the following will merely monitor the data traffic at its receiving input. As represented in FIG. 4, a memory sector may not only include a first address to which the token may be written, but may contain further addresses for further information.

In the upper part in FIG. 5, a memory sector is represented in which a token in the form of a bit combination of 8 hexadecimal fives has been entered, whereas in the lower part these hexadecimal fives have been inverted and correspondingly a hexadecimal A has been entered. This would mean that the token was withdrawn and, where appropriate, was allocated to another integrated circuit. In the case of token withdrawal, an erasure of the content at the memory address assigned to the token in the memory sector may, for instance, also be effected.

Figure 6:
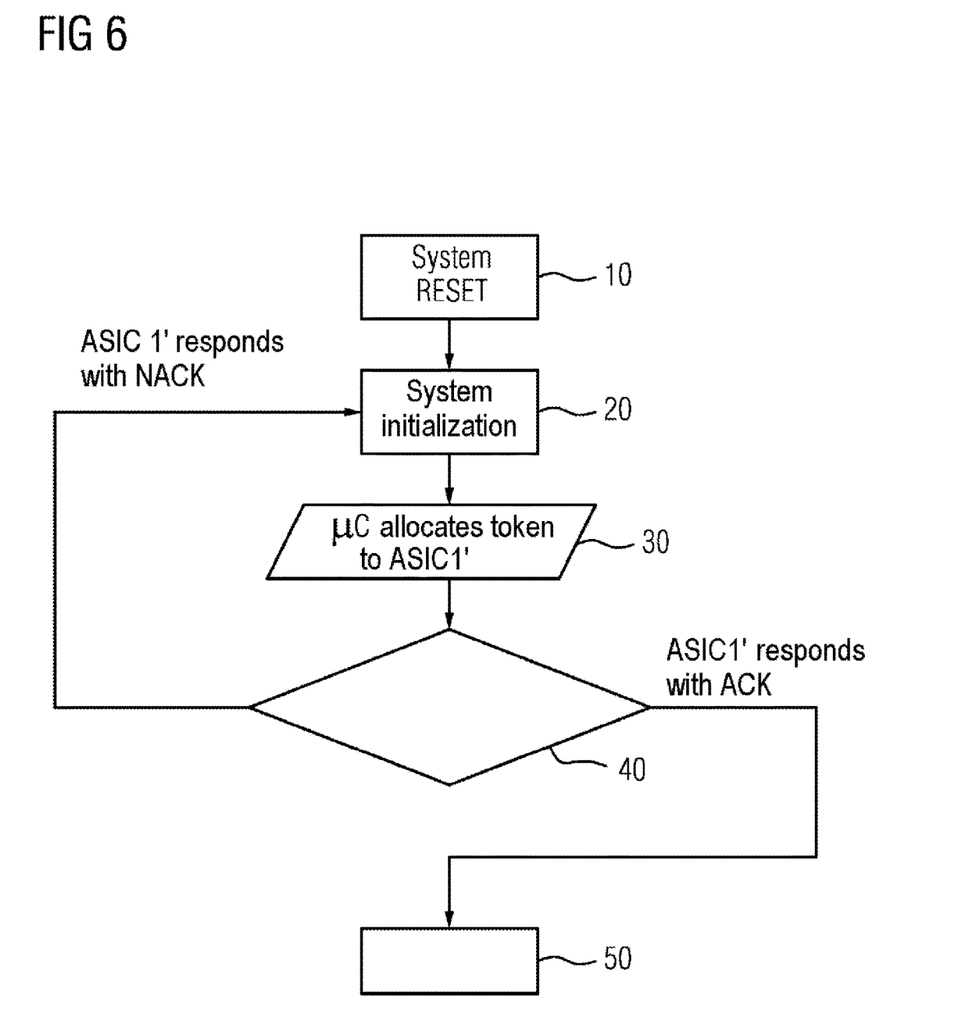

The process of the awarding of a token by the microprocessor μc will be illustrated with the aid of FIG. 6 on the basis of a flow chart. Accordingly, first of all in a step 10 the system is to be reset. Subsequently, in a step 20 the system is initialized. In a step 30 the microcontroller μC allocates, for instance, the token to the first integrated circuit ASIC1', by, as already described, a defined bit pattern, for instance according to FIG. 4, being written to base address BA1, known to the microcontroller μC, of the first integrated circuit ASIC1'. In a step 40 the integrated circuits arranged at the high-speed serial interface check whether the base address being considered coincides with their address which has been set at the address input ADDR, whereby in the event of a concordance and a successful entry of a token in the memory sector the first integrated circuit ASIC1' responds with a positive-acknowledgment signal ACK. As a consequence of this, the circuit has been activated and, in a step 50, may enter into communication with the microcontroller μC. This takes place until such time as the token is withdrawn from the first integrated circuit ASIC1'. In the event that the write operation has failed, a jump is made from step 40 back to step 20, and the awarding of the token is carried out again.

Figure 7:
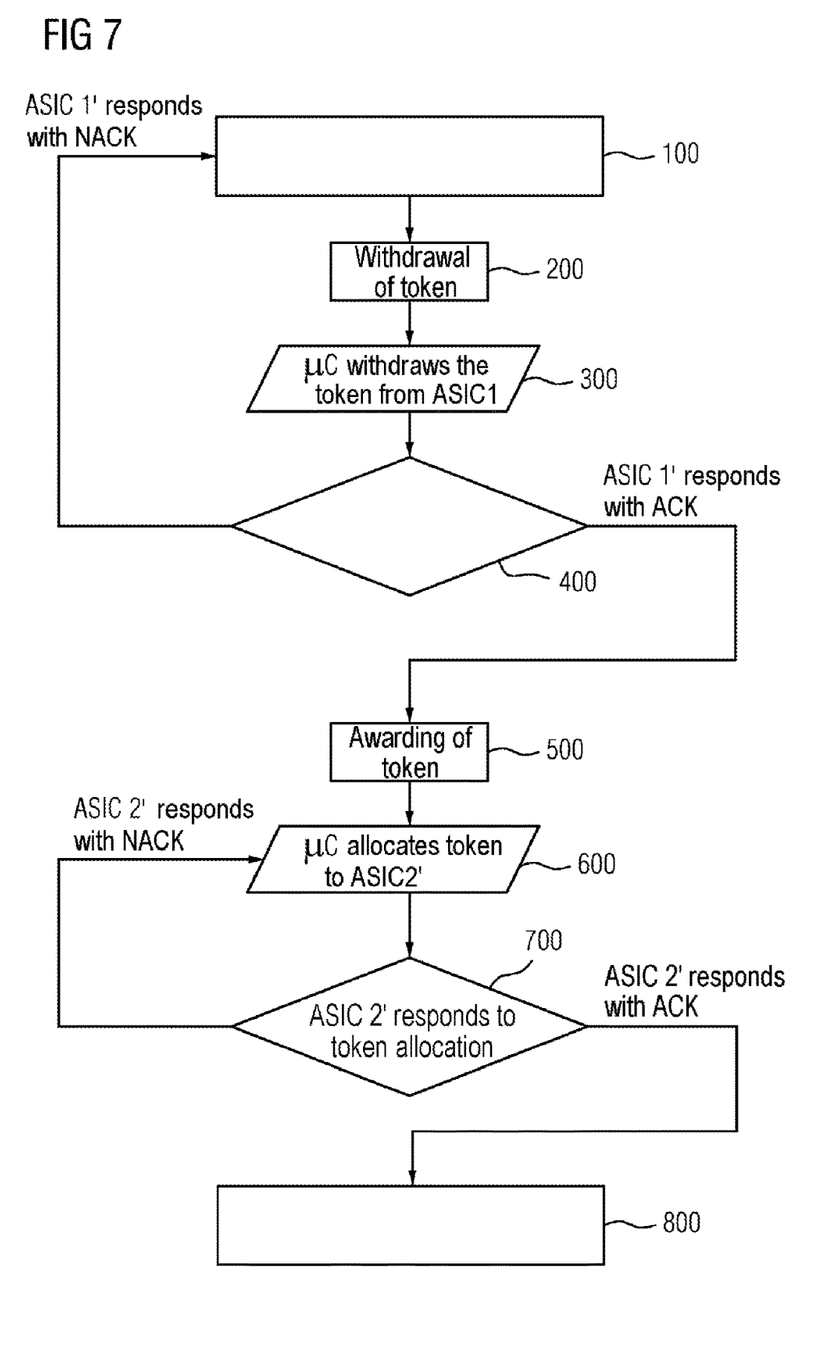

In FIG. 7, it is represented how the token is withdrawn. In a step 100 the first integrated circuit ASIC1' is to communicate with the microcontroller μC in accordance with the standard, as previously in step 50 of FIG. 6. In a step 200 the token is to be withdrawn from the first integrated circuit ASIC1', for which purpose in a step 300 the corresponding information is transmitted from the microcontroller μC to the first integrated circuit ASIC1'. In a step 400, the first integrated circuit ASIC1' checks whether the write operation into the memory sector containing the token, for instance by inverting the defined bit combination representing the token, was successful, and responds with a positive-acknowledgement signal ACK to the microcontroller μC in the case of a positive outcome of the check. In the case where the write operation has failed, a jump back to step 100 takes place.

After step 400, first of all none of the integrated circuits linked to the high-speed serial interface is active, so that, on the one hand, a new token may—though also must—be awarded. With step 500, this new awarding of a token takes place, whereby in a step 600 the microcontroller μC now transmits a write command to the base address of the second integrated circuit ASIC2', this being checked by both integrated circuits ASIC1', ASIC2', whereby only the second integrated circuit ASIC2' may establish a concordance and in the case of a positive check responds with a positive-acknowledgment signal ACK to the microcontroller if the operation of writing the token has been successful.

Should the write operation have failed, in accordance with FIG. 6 a jump is made back to step 600. Subsequently, in a step 800, by the activation of the second integrated circuit ASIC2' a standard communication of the microcontroller μC with the second integrated circuit ASIC2' takes place until the token is, where appropriate, withdrawn from said circuit in order to activate the first integrated circuit ASIC1' again.

With the described design, according to embodiments of the invention, of the ASICs, multi-ASIC operation may be realized in software. No additional hardware resources of any kind (for example, chip-select signals) are needed; the costs are consequently minimal. The actual HSSL/ZIPWIRE protocol remains unchanged; merely the memory area with the token memory sectors is introduced. As a result, this realization is compatible with all existing and future microcontrollers.

A number of implementations have been described. Nevertheless, it will be understood that various modifications may be made without departing from the spirit and scope of the disclosure. Accordingly, other implementations are within the scope of the following claims.

The invention claimed is:
1. An integrated circuit with at least one transmission port, at least one reception port and at least one address port, the integrated circuit comprising:
  a memory or a memory area which includes a number of memory sectors for storing activation information, wherein the number of memory sectors is equal to a number, codable by the at least one address port, of activatable integrated circuits configurable or configured for being operated on a common bus, and a control unit which is configured to compare the address coded by the at least one address port with an address received at the at least one reception port, and in the case of a positive comparison to write a defined bit pattern to a memory sector of the number of memory sectors that is assigned to the address, and in the case of a negative comparison to suppress a negative-acknowledgment signal at the at least one transmission port, wherein the integrated circuit is configured to be activated by the defined bit pattern in the memory sector that corresponds to the address defined at the at least one address port, for communication with a microprocessor connected to the at least one transmission port and the at least one reception port via the common bus.

2. The integrated circuit as claimed in claim 1, wherein the integrated circuit is configured to switch the at least one transmission port to high impedance in the case of the negative comparison of the address coded by the at least one address port with the address received at the at least one reception port.

3. The integrated circuit as claimed in claim 1, wherein the integrated circuit is configured such that when communicatively coupled to the microprocessor over the common bus, and in response to receiving a deactivation signal from the microprocessor, the integrated circuit changes the content of the memory sector described by the defined bit pattern.

4. The integrated circuit as claimed in claim 3, wherein the integrated circuit changes the content of the memory sector described by the defined bit pattern by inverting the content of the memory sector.

5. The integrated circuit as claimed in claim 4, wherein the integrated circuit changes the content of the memory sector described by the defined bit pattern by erasing the content from the memory sector.

6. A method for activating an integrated circuit from a group of at least two integrated circuits, connected via a bus to a master unit, for communication with the master unit, wherein the bus comprises at least one transmitting line, leading from the master unit to the at least two integrated circuits, and a receiving line leading from the at least two integrated circuits to the master unit, wherein the at least two integrated circuits include a number of memory sectors, and each integrated circuit includes an address port, the method comprising:

the master unit transmitting to the at least two integrated circuits linked to the bus a signal that contains a command for writing a defined bit pattern to the memory sector that corresponds to the address, coded at the address port, of the integrated circuit selected for a communication, and each integrated circuit comparing the memory-sector address with the address coded at the address port, and upon a positive comparison, writing the defined bit pattern only to the corresponding memory sector, and transmitting a positive-acknowledgment signal to the master unit, and upon a negative comparison, suppressing transmission of a negative-acknowledgement signal to the master unit, and suppressing further reaction to signals received from the master unit until reception of a new command from the master unit for writing to one of the memory sectors.

7. The method as claimed in claim 6, further comprising, in the case of the negative comparison, switching, by the corresponding integrated circuit, a transmission port of the corresponding integrated circuit connected to the at least one transmitting line to high impedance.

8. The method as claimed in claim 6, further comprising, prior to activation of another of the integrated circuits, deactivating, by the master unit, the integrated circuit presently activated by transmitting a deactivation signal unit to the presently activated integrated circuit, and changing, by the presently activated integrated circuit, content of the memory sector described by the defined bit pattern in response to reception of the deactivation signal.

9. The method as claimed in claim 8, wherein changing the content of the memory sector described by the defined bit pattern comprises inverting the content of the memory sector.

10. The method as claimed in claim 8, wherein changing of the content of the memory sector described by the defined bit pattern comprises erasing the content from the memory sector.

* * * * *